United States Patent [19]
Sato et al.

[11] Patent Number: 5,136,259
[45] Date of Patent: Aug. 4, 1992

[54] DIFFERENTIAL AMPLIFIER HAVING A BIAS STABILIZING CIRCUIT

[75] Inventors: Fumihiko Sato, Aichi; Toshio Hanazawa, Kasugai, both of Japan

[73] Assignee: Fujitsu Limited, Kawasaki, Japan

[21] Appl. No.: 747,980

[22] Filed: Aug. 21, 1991

[30] Foreign Application Priority Data

Aug. 23, 1990 [JP] Japan ................................. 2-224024

[51] Int. Cl.$^5$ ............................................ H03F 3/45
[52] U.S. Cl. .................................... 330/261; 330/257
[58] Field of Search .................. 330/9, 252, 257, 258, 330/261, 288, 296

[56] References Cited

U.S. PATENT DOCUMENTS

| | | | |
|---|---|---|---|
| 4,425,551 | 1/1984 | Blackner et al. | 330/261 |
| 4,575,685 | 3/1986 | Dobkin et al. | 330/261 |
| 4,760,286 | 7/1988 | Pigott | 330/261 X |
| 4,843,342 | 6/1989 | Hester et al. | 330/257 |

FOREIGN PATENT DOCUMENTS 57-81711 5/1982 Japan .
60-128703 7/1985 Japan .

*Primary Examiner*—Steven Mottola
*Attorney, Agent, or Firm*—Staas & Halsey

[57] ABSTRACT

A differential amplifier includes an input circuit outputting an input signal to be amplified, and a differential amplifier circuit having a first input terminal, a second input terminal, a first output terminal and a second output terminal. Complementary output signals are obtained at the first and second output terminals. An input bias circuit applies an input bias signal based on the input signal to the first input terminal of the differential amplifier circuit. A reference bias circuit applies a reference bias signal to the second input terminal of the differential amplifier circuit. A variation detecting circuit detects a variation in the input bias signal and generates a detection signal indicating a magnitude of the variation. A bias adjustment circuit adjusts the reference bias signal on the basis of the detection signal so that a difference between the input bias signal and the reference bias signal is always zero.

11 Claims, 7 Drawing Sheets

DIFFERENTIAL AMPLIFIER HAVING A BIAS STABILIZING CIRCUIT

BACKGROUND OF THE INVENTION (1) Field of the Invention

The present invention generally relates to semiconductor integrated circuits, and more particularly to a bias circuit for applying bias signals to a differential amplifier, which functions to, for example, amplify an oscillation signal.

(2) Description of the Prior Art

Recently, there has been considerable activity in the development of compact radio transmitter/receiver integrated circuits suitable for mobile communication devices, such as automobile telephones and portable telephones. The radio transmitter/receivers have an oscillation circuit for oscillating a predetermined frequency. In the past, such an oscillation circuit including an oscillation transistor was externally connected to an IC chip in which other circuit portions of the oscillation circuit were formed. However, most recently, an IC chip having a built-in oscillation transistor has been available.

FIG. 1 shows an oscillation transistor Q1 and a differential amplifier which functions as a buffer amplifier. The oscillation transistor Q1 and the buffer amplifier are formed in an IC chip. External structural parts are connected to the IC chip via broken lines, as shown in FIG. 1. A Colpitts type oscillation circuit is made up of the oscillatior transistor Q1, a crystal resonator CR, a capacitor C, a coil CL and a resistor RX. The buffer amplifier is composed of a differential amplifier circuit, a reference bias circuit, an input bias circuit and a current mirror bias circuit.

The differential amplifier circuit is composed of emitter-coupled transistors Q3 and Q4, resistors R3, R4 and R7, and a transistor Q7. The current mirror bias circuit is composed of transistors Q9 and Q10, and resistors R9 and R10. A constant-current circuit is composed of transistors Q7, Q9 and Q10, and resistors R7, R9 and R10. The reference bias circuit is composed of a transistor Q5, resistors R5 and R8, and a transistor Q8. The emitter of the transistor Q5 is connected to the emitter of the transistor Q4, and the collector of the transistor Q5 is connected to a Vcc power supply line. The resistor R5 is connected between the base and collector of the transistor Q5. A constant-current circuit is composed of the transistor Q8, the resistor R8, and the aforementioned current mirror bias circuit. The input bias circuit is composed of a transistor Q2, resistors R2 and R6 and a transistor Q6. The emitter of the transistor Q2 is connected to the base of the transistor Q3, and the collector of the transistor Q2 is connected to the Vcc line. The base of the transistor Q2 is connected to the base of the oscillation transistor Q1 via a resistor R1. The resistor R2 is connected between the base and collector of the transistor Q2. The resistor R6 and the transistor Q6 form, together with the aforementioned current mirror bias circuit, a constant current circuit. The transistors Q2 and Q5 have identical characteristics, and the transistors Q3 and Q4 have identical characteristics. Further, the transistors Q6 –Q9 have identical characteristics.

The external resistor Rx is adjusted to pass a desired amount of current through the oscillation transistor Q1, so that the oscillation circuit oscillates at a desired frequency. The oscillation-signal passes through the input buffer circuit, and is applied to the base of the transistor Q3. Complementary amplified oscillation outputs f1 and /f1 are obtained at the collectors of the transistors Q3 and Q4 where "/" means an opposite phase.

However, the conventional circuit shown in FIG. 1 has the following disadvantage. The adjustment of the external resistor Rx to obtain the desired oscillation frequency varies the base current of the oscillation transistor Q1 passing through the resistors R2 and R1. In response to a variation in the base current, the base potential of the transistor Q2 of the input bias circuit varies and thus the base potential of the transistor Q3 varies. Meanwhile, the base potential of the transistor Q4 of the reference bias circuit is fixed. Thus, the amplified oscillation outputs f1 and /f1 have an offset output based on a variation in the base potential of the transistor Q3. The oscillation outputs f1 and /f1 are used as, for example, local input signals of a mixer circuit located in the next stage of the buffer amplifier circuit. The mixer circuit mixes an intermediate frequency signal with the local input signals. In this case, the offset output degrades the frequency conversion characteristics of the mixer circuit.

In order to eliminate the above-mentioned disadvantage, it may be possible to provide a capacitor between the base terminal of the transistor Q2 and a node where the resistors R1 and R2 are connected in series. In this case, the output of the oscillation circuit is capacitively coupled to the input buffer circuit. However, use of such a capacitor requires a large area on the chip, so that the chip size and production costs increase.

SUMMARY OF THE INVENTION

It is a general object of the present invention to provide an improved differential amplifier having a bias stabilizing circuit in which the above-mentioned disadvantages are eliminated.

A more specific object of the present invention is to provide a differential amplifier capable of providing complementary outputs having no offset output even when an input signal of the differential amplifier varies.

The above-mentioned objects of the present invention are achieved by a differential amplifier comprising: an input circuit outputting an input signal to be amplified; a differential amplifier circuit having a first input terminal, a second input terminal, a first output terminal and a second output terminal, complementary output signals being obtained at the first and second output terminals; input bias circuit means, coupled to the input circuit and the differential amplifier circuit, for applying an input bias signal based on the input signal to the first input terminal of the differential amplifier circuit; reference bias circuit means, coupled to the differential amplifier circuit, for applying a reference bias signal to the second input terminal of the differential amplifier circuit; variation detecting means for detecting a variation in the input bias signal and for generating a detection signal indicating a magnitude of the variation; and bias adjustment means, coupled to the reference bias circuit means and the variation detecting means, for adjusting the reference bias signal on the basis of the detection signal so that a difference between the input bias signal and the reference bias signal is always zero.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 2:
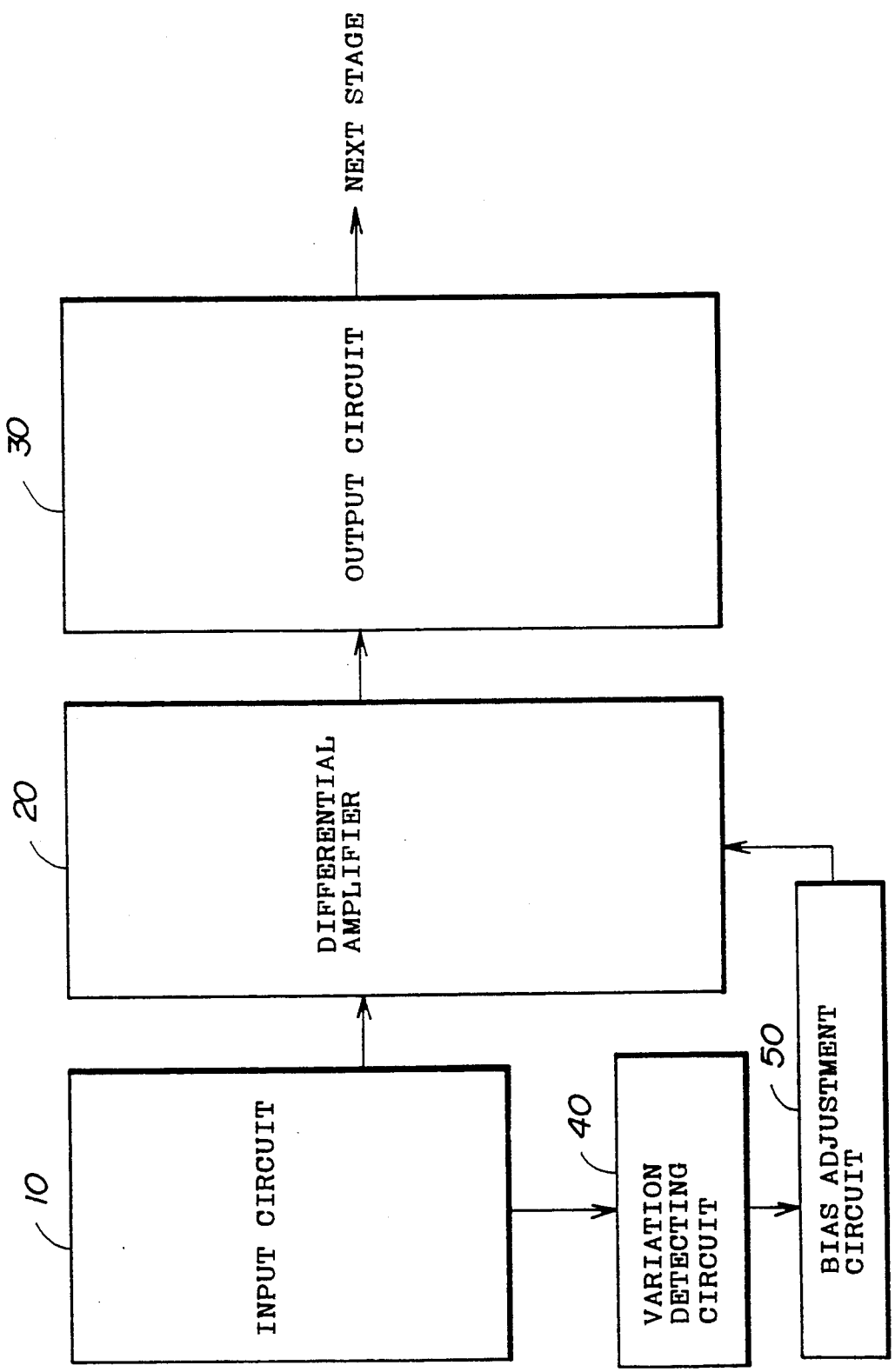
FIG. 2 is a block diagram showing an outline of the present invention.

FIG. 2 shows an outline of the present invention. A differential amplifier 20 receives an input signal from an input circuit 10, such as an oscillation circuit, and generates complementary outputs, which are input to an output circuit, such as a mixer circuit. The input signal supplied from the input circuit 10 serves as an input bias signal of the differential amplifier 20. A bias stabilizing circuit is composed of a variation detecting circuit 40 and a bias adjustment circuit 50. The variation detecting circuit 40 detects a variation in the input signal applied to the differential amplifier 20, and generates a detection signal indicating the magnitude of the detected variation. A bias adjustment circuit 50 adjusts a reference bias signal of the differential amplifier 20 on the basis of the detection signal so that the difference between the input and reference bias signals is always zero and thus the complementary outputs of the differential amplifier 20 have no offset voltage.

Figure 3:
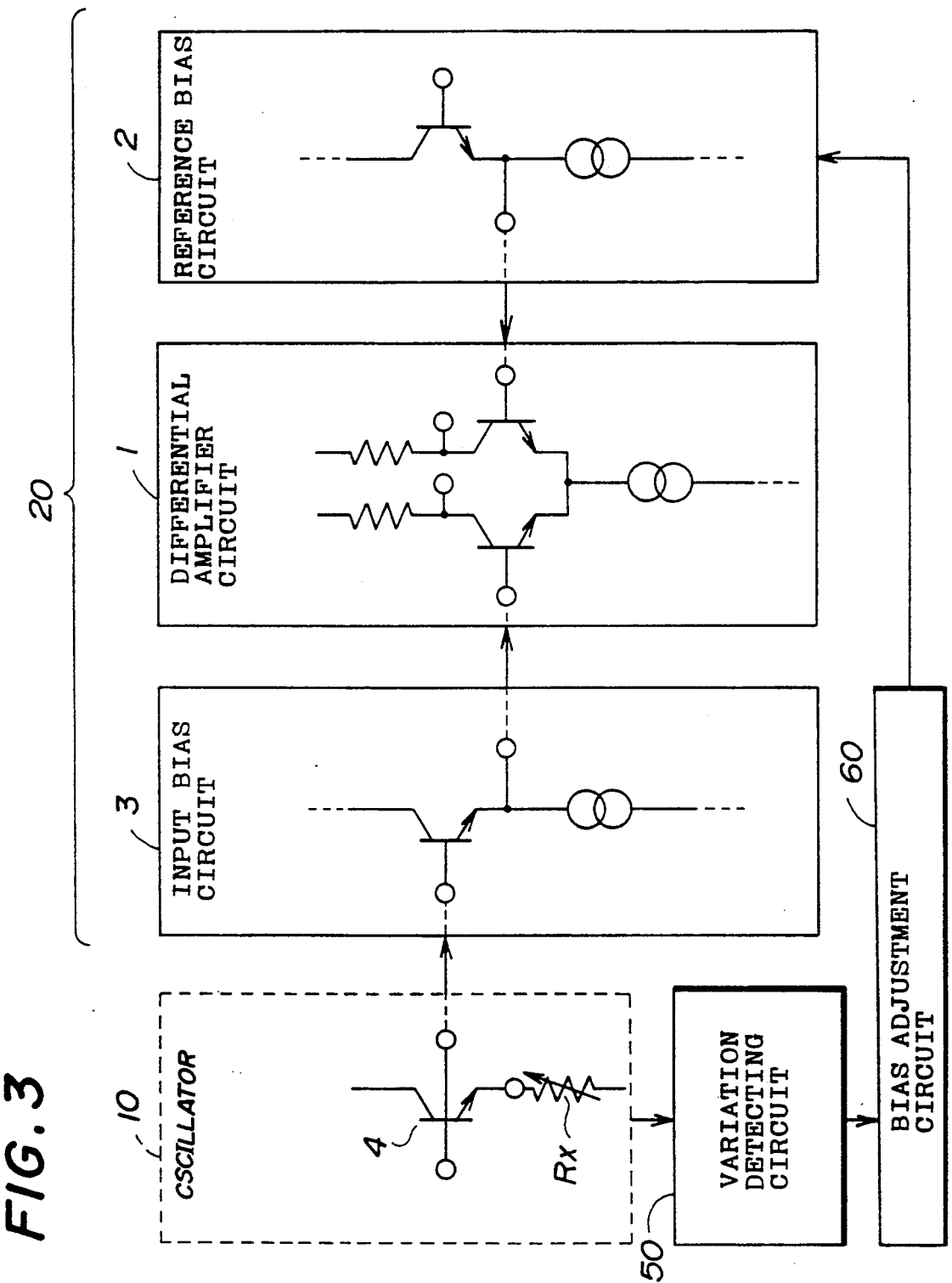
FIG. 3 is a block diagram showing the configuration shown in FIG. 2 in more detail.

FIG. 3 shows the configuration shown in FIG. 2 in more detail. The input circuit 10 includes an oscillation transistor 4 and the aforementioned external resistor Rx for adjusting the oscillation frequency. The differential amplifier 20 is made up of an input bias circuit 3, a differential amplifier circuit 1 and a reference bias circuit 2. The differential amplifier 1 has emitter coupled transistors, and a constant current source, and amplifies two input signals applied to input terminals (base terminals) of the emitter-coupled transistors. The reference bias circuit 2 is composed of a transistor and a constant current source, and applies a reference bias voltage to one of the two input terminals of the differential amplifier circuit 1. The input bias circuit 3 is composed of a transistor and a constant current source, and applies an input bias voltage to the other input terminal of the differential amplifier 1.

The oscillation transistor 4 forms, together with a crystal resonator, capacitors and resistors including the external resistor Rx, an oscillation circuit. The oscillation transistor 4 is formed, together with the differential amplifier 20 and the output circuit 30, in an IC chip. The external resistor Rx is externally connected to the IC chip. The base terminal of the oscillation transistor 4 is coupled to an input terminal of the input bias circuit 3 formed by the base of the transistor provided therein. The oscillation output generated by the oscillation circuit is applied to one of the input terminals of the differential amplifier circuit 1 via the input bias circuit 3. The external resistor Rx adjusts the current passing through the oscillation transistor 4. The variation detecting circuit 50 detects a variation in the input bias voltage applied to the input bias circuit 3 on the basis of the base current of the oscillation transistor 4. The bias adjustment circuit 3 adjusts the reference bias voltage generated by the reference bias circuit 2 on the basis of the variation detected by the variation detecting circuit 50 so that the difference between the input bias voltage and the reference bias voltage is zero.

Figure 1:
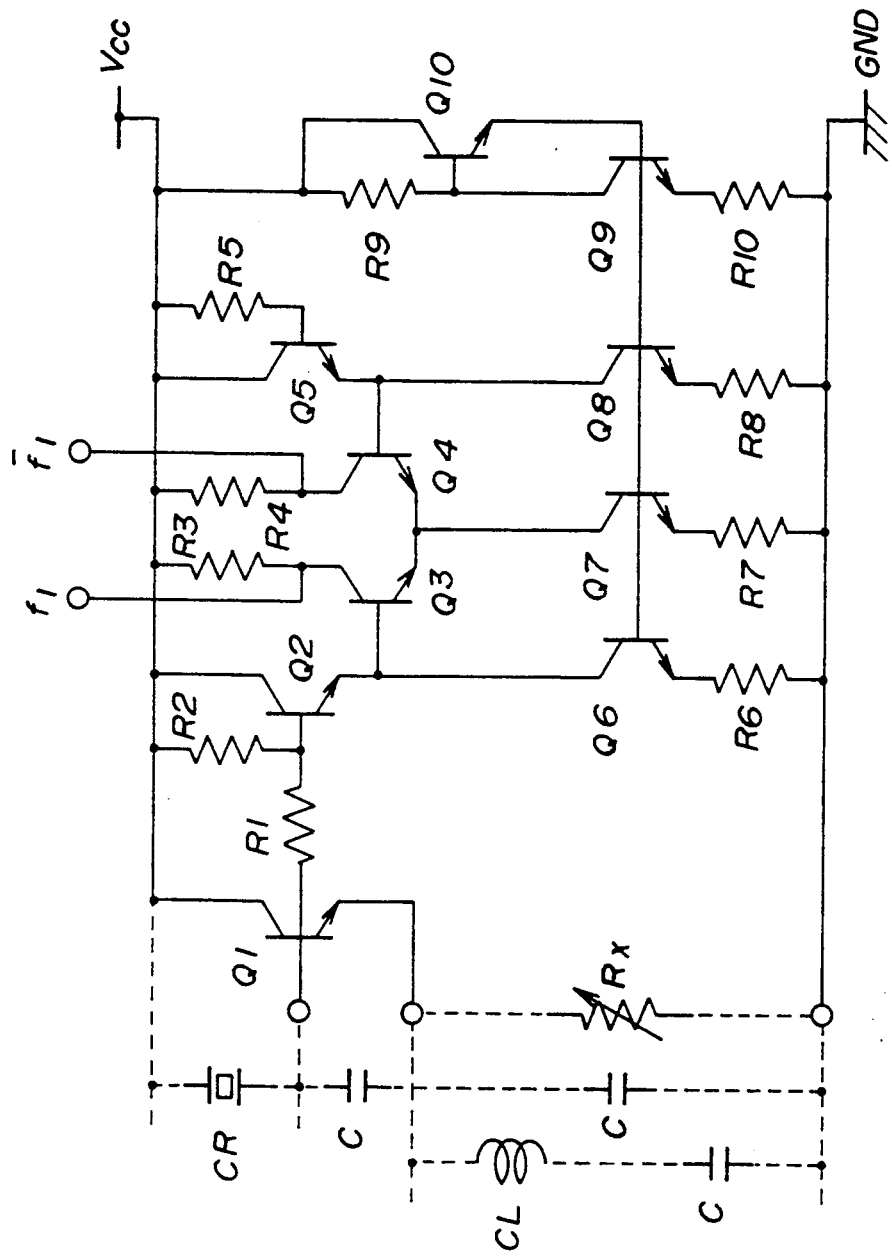
FIG. 1 is a circuit diagram of a conventional differential buffer amplifier for amplifying an oscillation signal.
Figure 4:
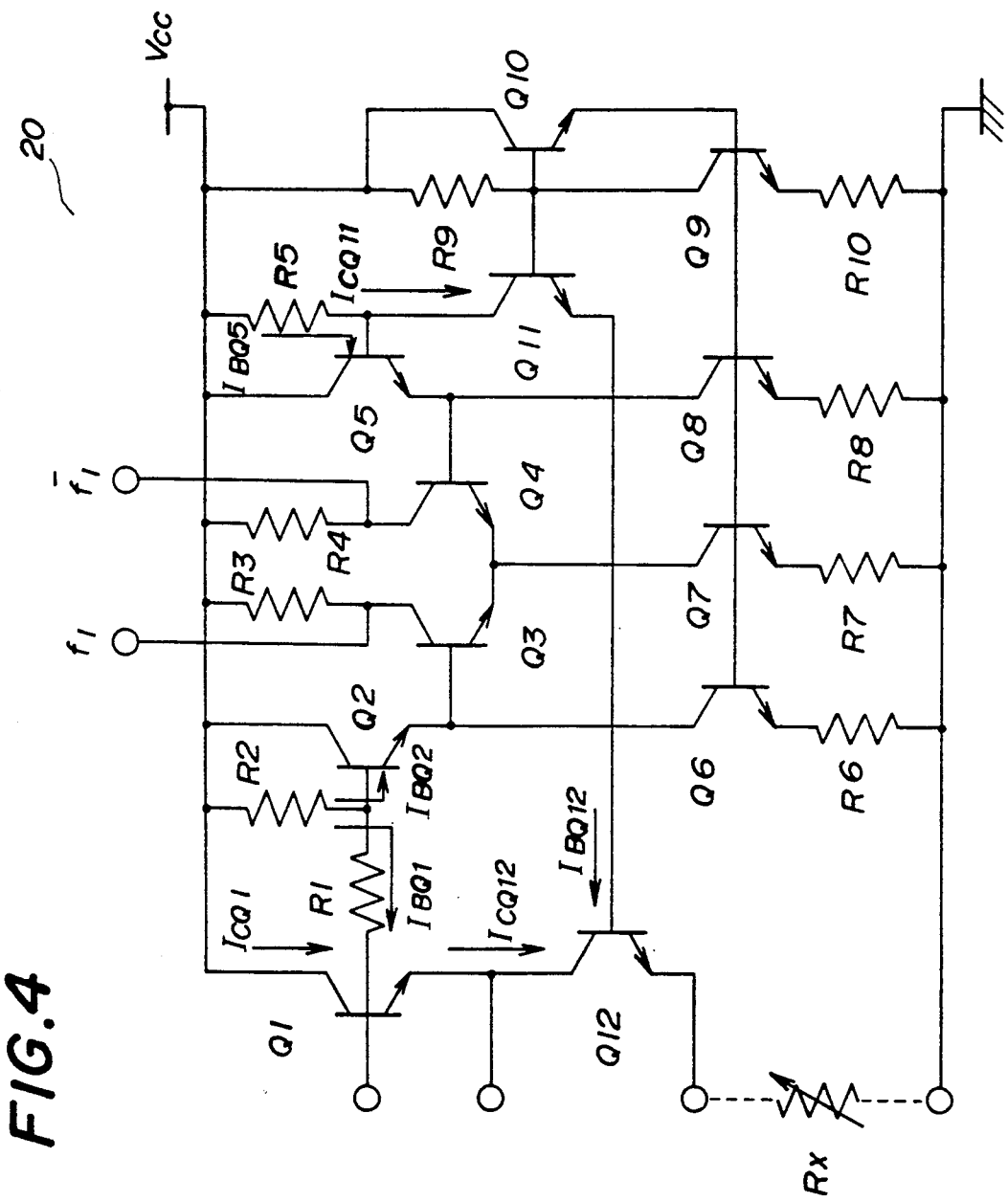
FIG. 4 is a circuit diagram of a buffer amplifier which corresponds to a differential amplifier shown in FIG. 2.

FIG. 4 shows the differential amplifier 20 shown in FIG. 2 in more detail. The differential amplifier 20 shown in FIG. 4 functions as, for example, a buffer amplifier provided on the output side of the oscillation circuit. In FIG. 4, those parts which are the same as those shown in the previously described figures are given the same reference numerals. It will be noted that transistors Q11 and Q12 are added to the circuit configuration shown in FIG. 1.

The base terminal of the transistor Q5 of the reference bias circuit 2 is connected to the collector of the transistor Q11, which corresponds to the aforementioned bias adjustment circuit 60. Hereafter, the transistor Q11 is referred to as adjustment transistor Q11. The base terminal of the adjustment transistor Q11 is connected to the base terminal of the transistor Q10 of the current mirror bias circuit, and the emitter of the adjustment transistor Q11 is connected to the base of the transistor Q12, which corresponds to the aforementioned variation detecting circuit 50. Hereafter, the transistor Q12 is referred to as detection transistor Q12. The collector of the detection transistor Q12 is connected to the emitter of the oscillation transistor Q1, and the emitter of the detection transistor Q12 is connected to an external terminal. The external resistor Rx, which is connected to two external terminals, is coupled to the emitter of the detection transistor Q12 and the ground.

The adjustment transistor Q11 applies a base voltage to the base of the detection transistor Q12 via the resistor R5. The detection transistor Q12 and the external resistor Rx form a current circuit, and passes a current through the oscillation transistor Q1.

A description will now be given of the operation of the buffer amplifier 20 shown in FIG. 4. Assuming now that the base voltage of the transistor Q3 (input bias voltage) is equal to the base voltage of the transistor Q4 (reference bias voltage), a voltage drop developed across the resistor R2 is equal to that developed across the resistor R5. In this state, the voltage drop across the resistor R2, $V_{R2}$, is written as follows:

$$V_{R2} = (I_{BQ2} + I_{BQ1})R2$$

where $I_{BQ2}$ is the base current of the transistor Q2, and $I_{BQ1}$ is the base current of the oscillation transistor Q1.

Meanwhile, the voltage drop developed across the resistor R5, $V_{R5}$, is written as follows:

$$V_{R5} = (I_{BQ5} + I_{CQ11})R5$$

where $I_{BQ5}$ is the base current of the transistor Q5, and $I_{CQ11}$ is the collector current of the transistor Q11. When $V_{R2} = V_{R5}$, the following stands:

$$(I_{BQ2} + I_{BQ1})R2 = (I_{BQ5} + I_{CQ11})R5.$$

The transistors Q2 and Q5 have identical characteristics, and are corrected to the respective constant current sources having identical characteristics. Thus, the following is obtained:

$$I_{BQ2} = I_{BQ5}.$$

Further, the following equation is obtained:

$$I_{BQ12} = I_{CQ11}[(h_{FE}+1)/h_{FE}]$$

and thus, $$I_{BQ12} \approx I_{CQ11}.$$

Further, the following is obtained:

$$I_{CQ1} \approx I_{CQ12}$$

where $I_{CQ1}$ is the collector current of the oscillation transistor Q1, and $I_{CQ12}$ is the collector current of the detection transistor Q12. Thus, the following is obtained:

$$I_{BQ1} \approx I_{BQ12} (\approx I_{CQ11}).$$

Thus, in the following relation:

$$(I_{BQ2}+I_{BQ1})R2 = (I_{BQ5}+I_{CQ11})R5.$$

It is possible to establish the relation $V_{R2} = V_{R5}$ by determining the resistances of the resistors R2 and R5 so that the difference between $I_{BQ1}$ and $I_{BQ12}$ as well as the difference between $I_{BQ12}$ and $I_{CQ11}$ are respectively canceled.

More specifically, when the external resistor Rx is adjusted in order to change the oscillation frequency, the collector current $I_{CQ1}$ of the oscillation transistor Q1 varies. At this time, if the collector current $I_{CQ1}$ of the oscillation transistor Q1 increases, the base current $I_{BQ1}$ thereof will increase. Thus, the input bias voltage decreases.

On the other hand, the increase in the collector current $I_{CQ1}$ of the oscillation transistor Q1 causes an increase in the collector current $I_{CQ12}$ ($\approx I_{CQ1}$) of the detection transistor Q12. That is, the increase in the collector current $I_{CQ1}$ increases the base current $I_{BQ12}$ ($\approx I_{CQ11}$) of the detection transistor Q12. Thus, when the base current $I_{BQ1}$ of the oscillation transistor Q1 increases and the input bias voltage of the transistor Q3 decreases, the collector current $I_{CQ11}$ of the adjustment transistor Q11 increases. As a result, the reference bias voltage of the transistor Q4 follows the increase in the collector current $I_{CQ11}$ so that it is always equal to the input bias voltage.

On the other hand, when the base current $I_{BQ1}$ of the oscillation transistor Q1 decreases, the input bias voltage of the transistor Q3 increases, and the collector current $I_{CQ11}$ of the adjustment transistor Q3 decreases. Thus, the reference bias voltage of the transistor Q4 follows the decrease in the collector current $I_{CQ11}$ so that it is always equal to the input bias voltage.

In the above-mentioned way, the reference bias voltage varies depending on a variation in the input bias voltage based on a variation in the oscillation frequency. Thus, the oscillation outputs f1 and /f1 obtained at the collectors of the transistors Q3 and Q4 do not have any offset output.

Figure 5:
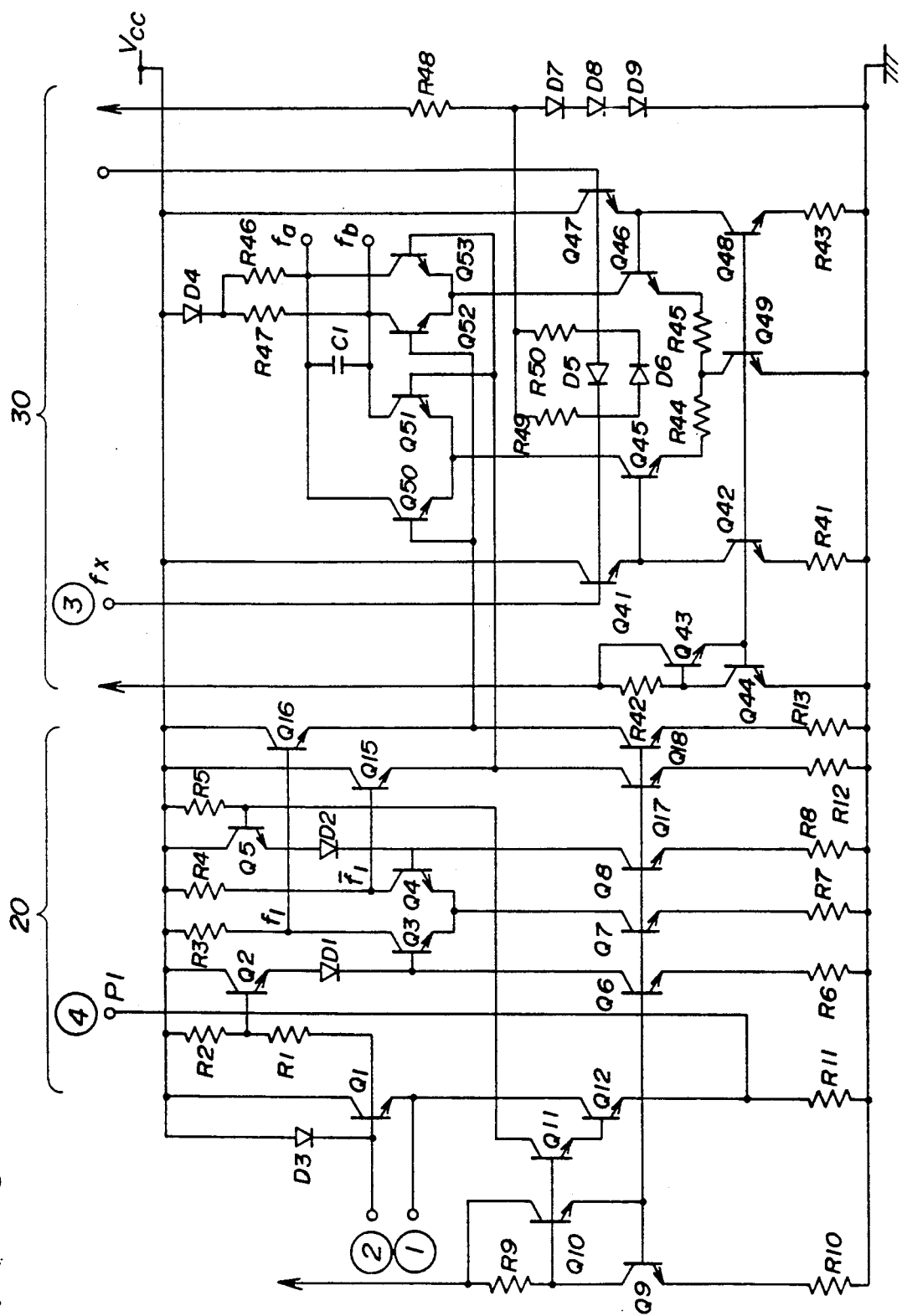
FIG. 5 is a circuit diagram of the circuit configuration shown in FIG. 2.

FIG. 5 shows the circuit configuration shown in FIG. 2 in more detail. In FIG. 5, those parts which are the same as those shown in the previously described figures are given the same references. The output circuit 30 following the buffer amplifier 20 is a mixer circuit. The buffer amplifier (differential amplifier) 20 shown in FIG. 5 has the same circuit configuration as that shown in FIG. 4 except that diodes D1, D2 and D3 are provided. More specifically, the diode D1, which serves as a level shift diode, is connected between the emitter of the transistor Q2 and the base of the transistor Q3. Similarly, the level shift diode D2 is connected between the emitter of the transistor Q5 and the base of the transistor Q4. The diode D3, which is connected between the Vcc line and the base of the oscillation transistor Q1, functions to limit the amplitude of the oscillation signal. The external resistor Rx is connected to an external pad (terminal) P1, so that a parallel resistor circuit composed of the external resistor Rx and resistor R11 is formed. This parallel resistor circuit adjusts the current of the detection transistor Q12.

The amplified oscillation outputs f1 and /f1 are respectively output to the mixer circuit 30 via the emitter follower transistors Q15 and Q16 which function as level shift circuits. A constant current circuit composed of transistors Q17 and Q18 and resistors R12 and R13 is connected to the transistors Q15 and Q16.

The mixer circuit 30, which is a double balanced mixer circuit, respectively mixes the amplified oscillation outputs f1 and /f1 with an IF input fx, and outputs fa (=fxa+f1a) and fb (=fxa−f1a) where fxa is the frequency of the IF input fx, and f1a is the frequency of the oscillation output f1. The IF input fx is applied to the base of a transistor Q45 via a transistor Q41 serving as a level shift circuit. A transistor Q42 and a resistor R41 form a constant current source together with a current mirror circuit having transistors Q43 and Q44 and a resistor R42. The transistor Q45 forms, together with a transistor Q46, a differential amplifier. A reference bias voltage is applied to the base of the transistor Q46 via a level shift transistor Q47. A transistor Q48 and a resistor R43 form, together with the above-mentioned current mirror circuit, a constant current circuit provided for the transistor Q47, and a transistor Q49 forms, together with the current mirror circuit, a constant current circuit for the transistors Q45 and Q46. The emitters of the transistors Q45 and Q46 are coupled together via resistors R44 and R45. A resistor R48 and three diodes D7–D9 form a constant voltage circuit. A constant voltage generated by this constant voltage circuit is applied to the bases of the transistors Q41 and Q47 via resistors R49 and R50, respectively. Diodes D5 and D6 for use in protection are connected between the bases of the transistors Q41 and Q47, respectively.

The collector of the transistor Q45 is connected to the emitters of the transistors Q50 and Q51. Similarly, the collector of the transistor Q46 is connected to the emitters of transistors Q52 and Q53, which form a differential amplifier. The Vcc line is coupled to the collectors of the transistors Q50 and Q53 via a diode D4 and a resistor R46, and coupled to the collectors of the transistors Q51 and Q52 via the diode D4 and a resistor R47. The amplified oscillation output f1 is applied to the bases of the transistors Q50 and Q52, and the amplified oscillation output /f1 is applied to the bases of the transistors Q51 and Q53. A capacitor C1 is connected between the collectors of the transistors Q50 and Q51.

The transistors Q50 and Q51 forming the differential amplifier alternately operates for every half of the identical periods of the oscillation frequencies f1 and /f1, and control the switching of the collector current of the transistor Q45. The transistors Q52 and Q53 forming the differential amplifier alternately operations for every other half of the identical periods of the oscillation frequencies f1 and /f1, and control the switching of the collector current of the transistor Q45. Thus, the oscillation output f1 is mixed with the IF input fx, and the oscillation output /f1 is mixed with the IF input fx, so that the aforementioned outputs fa and fb are generated.

The differential amplifier composed of Q50 and Q51 and the differential amplifier composed of Q52 and Q53 are switched by the oscillation outputs f1 and /f1 without any offset voltage. As a result, the characteristics of the mixer circuit 30 do not degrade and the outputs fa and fb have no distortion.

Figure 6:
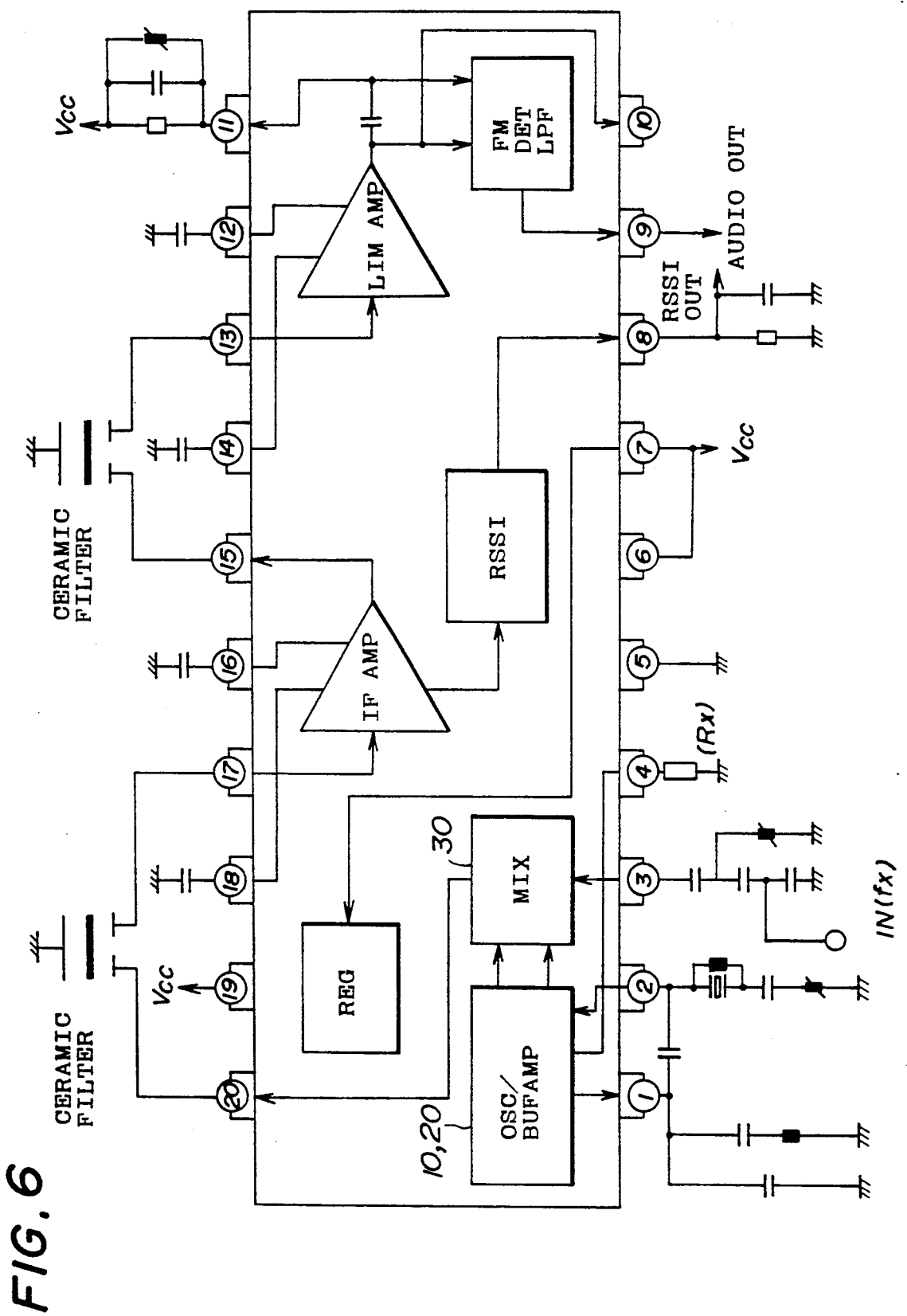
FIG. 6 is a diagram showing a radio transmitter/receiver IC chip to which the present invention is applied.

FIG. 6 shows a radio transmitter/receiver IC chip having the aforementioned oscillation circuit 10, the buffer amplifier 20 and the mixer circuit 30. A terminal ① is connected to the emitter of the oscillation transistor Q1 shown in FIG. 5, and a terminal ② is connected to the base of the oscillation transistor Q1. Capacitors, resistors and a crystal resonator are coupled to the terminals 1 and 2, as shown in FIG. 6, so that the aforementioned oscillation circuit including the oscillation transistor Q1 is formed. A terminal ④ is ground via the external resistor Rx, which is coupled to one end of the resistor R11 shown in FIG. 20. The IF input is applied to a terminal ③ via capacitors shown in FIG. 6. Further, the IC chip shown in FIG. 6 is provided with, in the same way as a conventional radio transmitter/receiver IC chip, an IF amplifier (IF AMP), a limiter amplifier (LIM AMP), an FM detection/lowpass filter (FM DET LPF), a regulator block (REG) for generating a regulated power supply voltage, and a level detection block (RSSI) for detecting a signal level used for determining whether or not a transmission power should be reduced.

Figure 7:
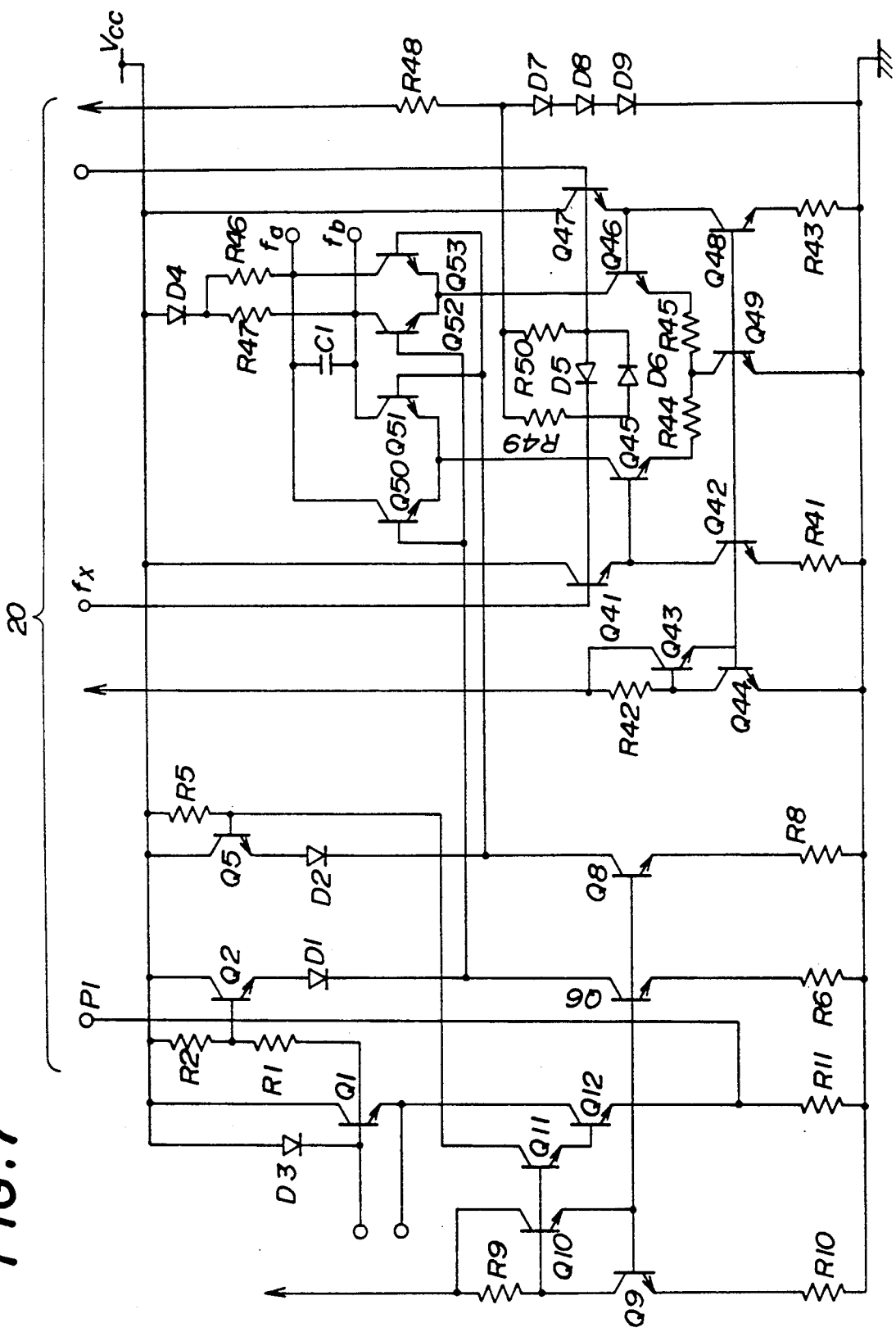
FIG. 7 is a circuit diagram of a variation of the circuit configuration shown in FIG. 5.

FIG. 7 is a variation of the circuit configuration shown in FIG. 5. In FIG. 7, those parts which are the same as those shown in FIG. 5 are given the same reference numerals. The circuit configuration shown in FIG. 7 does not have the buffer amplifier circuit composed of the transistors Q3 and Q4 shown in FIG. 5. That is, the oscillation signal generated by the oscillation transistor Q1 is directly input to the mixer circuit. It will be noted that the differential amplifiers which are to be controlled by the present invention are included in the mixer circuit. Thus, the circuit configuration shown in FIG. 7 corresponds to the differential amplifier 20 shown in FIG. 2.

More specifically, the cathode of the diode D1 is connected to the bases of the transistors Q50 and Q52, and the cathode of the diode D2 is connected to the bases of the transistors Q51 and Q53. The adjustment transistor Q11 and the detection transistor Q12 are provided in the same way as those shown in FIG. 5. With the circuit configuration shown in FIG. 7, it is possible to suppress the difference between the input and reference bias voltages applied to the differential amplifier composed of the transistors Q50 and Q51 and the differential amplifier composed of the transistors Q52 and Q53.

The present invention is not limited to the specifically disclosed embodiments, and variations and modifications may be made without departing from the scope of the present invention.

What is claimed is:

1. A differential amplifier comprising:

an input circuit outputting an input signal to be amplified;

a differential amplifier circuit having a first input terminal, a second input terminal, a first output terminal and a second output terminal, complementary output signals being obtained at said first and second output terminals;

input bias circuit means, coupled to said input circuit and said differential amplifier circuit, for applying an input bias signal based on said input signal to the first input terminal of said differential amplifier circuit;

reference bias circuit means, coupled to said differential amplifier circuit, for applying a reference bias signal to the second input terminal of said differential amplifier circuit;

variation detecting means for detecting a variation in said input bias signal and for generating a detection signal indicating a magnitude of the variation; and bias adjustment means, coupled to said reference bias circuit means and said variation detecting means, for adjusting the reference bias signal on the basis of said detection signal so that a difference between said input bias signal and said reference bias signal is always zero.

2. A differential amplifier as claimed in claim 1, wherein:

said variation detecting means comprises means for detecting a variation in a current passing through said input circuit; and the variation in said current passing through the input circuit corresponds to the variation in said input bias signal.

3. A differential amplifier as claimed in claim 1, wherein:

said input circuit comprises a first transistor having a first terminal receiving a first power supply voltage, a base coupled to said input bias circuit means, and a second terminal;

said variation detection means comprises a second transistor having a first terminal coupled to the second terminal of said first transistor, a second terminal grounded via a first resistor, and a base; and said bias adjustment means comprises a third transistor having a first terminal coupled to said reference bias circuit means, a second terminal coupled to the base of said second transistor, and a base receiving a predetermined base voltage.

4. A differential amplifier as claimed in claim 1, wherein said reference bias circuit means comprises:

a transistor having a first terminal receiving a predetermined power supply voltage, a second terminal coupled to the second input terminal of said differential amplifier circuit, and a base; and a resistor coupled between the first terminal of said transistor and the base thereof, and wherein said bias adjustment means comprises means for adjusting a base voltage of said transistor on the basis of said detection signal.

5. A differential amplifier as claimed in claim 3, wherein said reference bias circuit means comprises:

a fourth transistor having a first terminal receiving said first power supply voltage, a second terminal coupled to the second input terminal of said differential amplifier circuit, and a base coupled to the first terminal of said third transistor; and a second resistor coupled between the first terminal of said transistor and the base thereof.

6. A differential amplifier as claimed in claim 3, wherein said first transistor is an oscillation transistor which oscillates at a frequency based on said input signal.

7. A differential amplifier as claimed in claim 1, wherein:
said input signal is an oscillation signal; and
said differential amplifier circuit is a buffer amplifier followed by a mixer circuit which receives said complementary amplified outputs from said differential amplifier circuit and respectively mixes a predetermined signal with said amplified outputs.

8. A differential amplifier as claimed in claim 1, wherein:
said input signal is an oscillation signal; and
said differential amplifier circuit is a mixer circuit which mixes a predetermined signal with said input bias signal and said reference bias signal.

9. A differential amplifier as claimed in claim 3, wherein said first resistor comprises a variable resistor.

10. A differential amplifier as claimed in claim 9, wherein said differential amplifier is formed on an IC chip, and said variable resistor is externally provided.

11. A differential amplifier as claimed in claim 1, wherein:
said input circuit comprises a first transistor having a first terminal receiving a first power supply voltage, a base coupled to said input bias circuit means, and a second terminal;
said variation detection means comprises a second transistor having a first terminal coupled to the second terminal of said first transistor, a second terminal grounded via a first resistor, and a base;
said bias adjustment means comprises a third transistor having a first terminal coupled to said reference bias circuit means, a second terminal coupled to the base of said second transistor, and a base receiving a predetermined base voltage; and
said reference bias circuit means comprises a fourth transistor having a first terminal receiving said first power supply voltage via a second resistor, a second terminal coupled to the second input terminal of said differential amplifier circuit, and a base coupled to the first terminal of said third transistor.

* * * * *

UNITED STATES PATENT AND TRADEMARK OFFICE
CERTIFICATE OF CORRECTION

PATENT NO. : 5,136,259
DATED : August 4, 1992
INVENTOR(S) : Fumihiko SATO et al.

It is certified that error appears in the above-indentified patent and that said Letters Patent is hereby corrected as shown below:

Title PAGE:
  item [75] Inventors: change "Aichi" to --Ama--;
  item [73] Assignee: after "Kawasaki," insert --Fujitsu VLSI Limited, Kasugai, both of--.

Col. 1, line 31, change "oscillatior" to --oscillation--.

Col. 3, line 40, delete ":".

Col. 4, line 62, after "collector" delete ".";
      line 68, change "corrected" to --connected--.

Signed and Sealed this

Fifteenth Day of March, 1994

Attest:

BRUCE LEHMAN

Attesting Officer

Commissioner of Patents and Trademarks